United States Patent [19]

Svedberg

[11] Patent Number: 4,509,089

[45] Date of Patent: Apr. 2, 1985

[54] TWO-POLE OVERCURRENT PROTECTION DEVICE

[75] Inventor: Per Svedberg, Vällingby, Sweden

[73] Assignee: ASEA Aktiebolag, Vasteras, Sweden

[21] Appl. No.: 497,326

[22] Filed: May 23, 1983

[30] Foreign Application Priority Data

Jun. 3, 1982 [SE] Sweden .................................. 8203432

[51] Int. Cl.$^3$ ...................... H02H 3/08; H03K 17/72
[52] U.S. Cl. ...................... 361/100; 361/58; 361/91; 307/252 C; 307/252 T; 307/305; 357/39; 357/38
[58] Field of Search ............... 361/100, 91, 58, 111; 307/252 A, 252 B, 252 C, 252 T, 252 N, 305, 200 A; 357/23, 38, 39

[56] References Cited

U.S. PATENT DOCUMENTS

| 3,263,128 | 7/1966 | White | 307/252 C |
| 4,224,634 | 9/1980 | Svedberg | 357/39 X |
| 4,244,000 | 1/1981 | Ueda et al. | 357/39 |
| 4,331,884 | 5/1982 | Svedberg | 361/91 X |

Primary Examiner—Patrick R. Salce
Attorney, Agent, or Firm—Pollock, Vande Sande & Priddy

[57] ABSTRACT

A two-pole overcurrent protection device comprises an integrated circuit with a thyristor having an emitter layer and base layer which, on the cathode side, is connected to the emitter layer on the cathode side by means of a normally non-conducting MOS transistor. The on-state voltage across the thyristor is supplied to the control electrode of the transistor via a Schottky diode, whereby, at a certain thyristor current, the thyristor is made conducting and short-circuits the cathode-emitter junction. The edge of the Schottky diode is arranged adjacent to the cathode base layer and at such a distance therefrom that the barrier layer at the center junction of the thyristor penetrates into the diode and limits the voltage on the control means of the MOS transistor to a harmless value.

3 Claims, 2 Drawing Figures

TWO-POLE OVERCURRENT PROTECTION DEVICE

BACKGROUND OF THE INVENTION

1. Field of the Invention

This invention relates to a two-pole overcurrent protection device for connection into a current-carrying conductor. In particular the two-pole overcurrent protection device is of the kind comprising a normally conducting thyristor provided with turn-off means and having, in the following order, a first emitter layer, a first base layer, a second base layer, and a second emitter layer, and an MOS transistor integrated with the thyristor, connected in parallel with the PN-junction between said first emitter layer and said first base layer and arranged, when the voltage across the thyristor exceeds a predetermined value, to short-circuit the said PN-junction for turning off the thyristor.

2. Description of the Prior Art

A two-pole overcurrent protection device of the kind referred to has previously been disclosed in U.S. Pat. No. 4,331,884 (issued on May 25, 1982 to Per Svedberg and assigned to the assignees of this application). In this known overcurrent protection device, zener diodes are arranged to protect control means of the field effect transistor parts from impermissibly high voltages. These zener diodes are made in the same integrated circuit as the other parts of the overcurrent protection device. However it has proved that when one of the two thyristor portions of the overcurrent protection device is current-carrying, the charge carriers then generated give rise to large leakage currents in the zener diodes, which has an adverse effect on the functioning of the known overcurrent protection device.

SUMMARY OF THE INVENTION

The present invention aims to provide a two-pole overcurrent protection device of the kind referred to, in which control means of the field effect transistor parts are effectively protected from overvoltages without the above-mentioned disadvantages arising.

According to the present invention a two-pole overcurrent protection device of the kind referred to is characterized in that the MOS transistor has control means connected via a Schottky diode to said second base layer of the thyristor, the Schottky diode comprising a junction between said second base layer and a contact layer arranged on said second base layer and connected to said control means of the MOS transistor, being arranged adjacent to, but separated from, a semiconductor layer which is of the same conduction type as said first base layer and which is connected to said first emitter layer, and having a reverse direction which coincides with the blocking direction of the thyristor.

BRIEF DESCRIPTION OF THE DRAWINGS

An embodiment of the invention will now be described, by way of example, with reference to the accompanying drawings, in which.

DESCRIPTION OF THE PREFERRED EMBODIMENT

Figure 1:
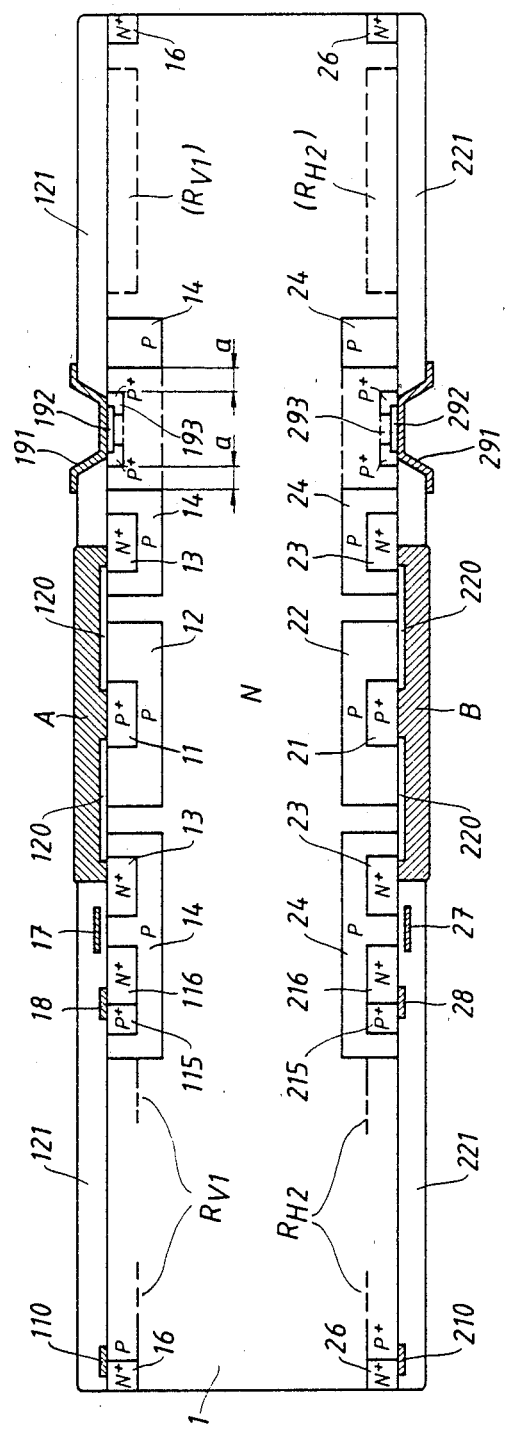
FIG. 1 is a sectional view through an overcurrent protection device according to the invention.

The two-pole overcurrent protection device shown in the drawings is made, in a similar way as described in the above-mentioned U.S. Pat. No. 4,331,884. In particular it will be noticed that the equivalent circuit diagram shown in FIG. 2 is similar in many respects to the equivalent circuit diagram shown in FIG. 1 of U.S. Pat. No. 4,331,884. The only differences between the two circuit diagrams are that in the embodiment of the present invention shown in FIG. 2, Schottky diodes $SD_H$ and $SD_V$ have replaced, respectively, the series-connected resistor $R_{H2}$, diode $D_{H2}$ and diode $D_{H3}$ and the series-connected resistor $R_{V2}$, diode $D_{V2}$ and diode $D_{V3}$, and varactors $V_H$ and $V_V$ have replaced, respectively, the zener diodes $Z_H$ and $Z_V$. In all other respects the circuit diagrams are similar.

Figure 2:
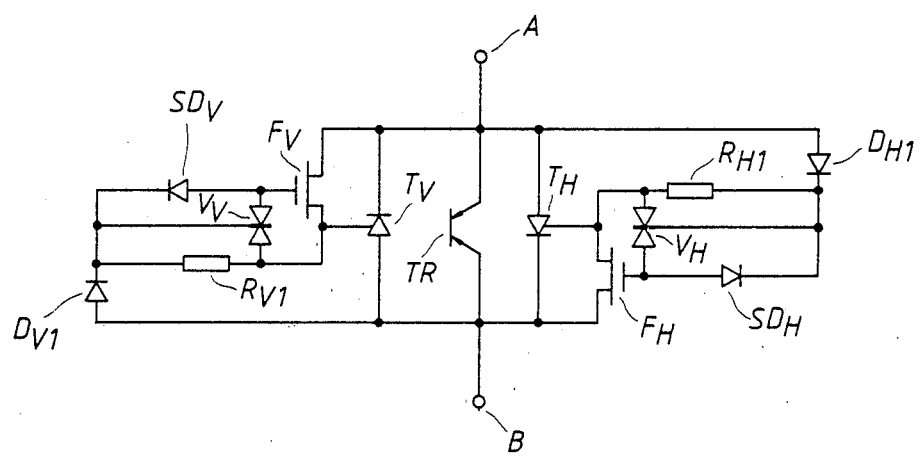
FIG. 2 is an equivalent circuit diagram of the overcurrent protection device shown in FIG. 1.

As can be seen in FIG. 1, the embodiment of two-pole overcurrent protection device according to the present invention is formed as an integrated circuit in a disc of semiconductor material, preferably silicon. In particular the disc has an N-doped main portion 1 which constitutes the N base both in the thyristors $T_H$ and $T_V$ (see FIG. 2) and in the "transistor portion" TR. Centrally at the upper surface of the disc, there are arranged a P-doped layer 12 and, within this layer on the upper surface of the disc, a P+-doped layer 11. Around the layers 11 and 12 there is arranged a P-conducting annular layer 14 within which there is arranged an N+-doped annular layer 13. At the lower surface of the disc, layers 21–24 are arranged in the same way as the layers 11–14 at the upper surface of the disc. The layers 11 and 13 are connected to the connection terminal A and the layers 21 and 23 are connected to the connection terminal B.

By a "P+-doped" (P+-conducting) layer is meant a layer with a stronger doping than a "P-doped" (P-conducting) layer, and the corresponding applies to an "N+-doped" and an "N-doped" layer.

The thyristor $T_H$ (see FIG. 2) is formed by the layers 11, 12, 1, 24 and 23. When the thyristor is conducting, the current flows laterally through layer 1 from layer 12 to layer 24. This current consists essentially of minority charge carriers, i.e. holes, injected into layer 1 from layer 12.

The transistor portion TR (see FIG. 2) consists of the layers 11, 12, 1, 22, 21 and is thus of PNP type. At low current through the thyristor $T_H$, the lower PN junction (between layers 22 and 1) of the transistor portion is not blocking or weakly injecting. None, or only a few, of the holes injected from layer 12 into layer 1 are then sucked up by the junction. When the current through the thyristor increases, the on-state voltage drop therein increases, and as a consequence of the increased voltage an increasing reverse blocking voltage is applied on the junction 1–22 and said junction sucks up an increasing proportion of the holes injected into the layer 1. This causes the current amplification of the PNP section of the thyristor $T_H$ to drop, which tends to further increase the on-state voltage across the thyristor. This leads to a rapid increase of the thyristor voltage when the current approaches a predetermined limit value, which can be set by a suitable choice of the life of the charge carriers in the layer 1 in relation to the inner radius of the peripheral P layer 14 and to the thickness of the N base layer 1.

Since the layer 11 with high injection is arranged centrally in the disc, a substantially laterally functioning PNP transistor portion is obtained in the thyristor $T_H$, and this results in the above-described mode of operation.

The thyristor $T_V$ (see FIG. 2) consists of the layers 21, 22, 1, 14, 13 and operates in a manner corresponding to that described for the thyristor $T_H$ described above.

The components belonging to the control circuit for the thyristor $T_V$ are formed at the upper surface of the disc, whereas the components belonging to the control circuit of the thyristor $T_H$ are formed at the lower surface of the disc.

As previously mentioned the layers 13 and 14 are annular and surround the central layers 11 and 12. The contact A which is metallic and circular, makes contact with the layers 11 and 13, and constitutes one terminal of the overcurrent protection device, is insulated from the layers 12, 1, 14 by an underlying silicon dioxide layer 120. Outside the layer 13 there are formed in the layer 14 an N+-doped layer 116 and a P+-doped layer 115 arranged adjacent the layer 116. These two layers are annular with the exception of a sector (on the right-hand side in FIG. 1) where the Schottky diode $SD_V$ is formed. An electrical contact 18, for example of platinum silicide, bridges the junction between the layers 115 and 116. On the upper surface of the disc there is arranged an insulating silicon dioxide layer 121, and in this the control means 17 of the MOS transistor $F_V$ is arranged in the form of a layer of metal or polysilicon. The transistor consists of the layers 13, 14 and 116. The latter is ohmically connected, via the contact 18 and the layer 115, to the P-base 14 of the thyristor $T_V$. When the control means 17 controls the transistor to conducting state, the P-base 14 of the thyristor therefore becomes connected to the N+ emitter 13 of the thyristor through a low-impedance ohmic connection. Thus, the injecting emitter junction 13–14 is by-passed, and the thyristor is turned off.

At the edge of the upper surface of the component there is arranged an annular N+-doped zone 16. This zone constitutes the common point (see FIG. 2) for the diode $D_{V1}$ and the resistor $R_{V1}$. The diode $D_{V1}$ consists of the anode emitter junction (21–1) of the thyristor $T_V$. The resistor $R_{V1}$ consists of a narrow and elongate P-doped layer disposed at the upper surface of the disc on the left-hand side of FIG. 1 in a tortuous, e.g. a meander or spiral, line between the layers 14 and 16. One end of the resistor $R_{V1}$ is ohmically connected to the N+-doped zone 16 by means of a contact 110 and the other end of the resistor is connected to the P-base layer 14 of the thyristor.

The Schottky diode $SD_V$ is arranged in, for example, a circular or square opening in the layer 14 on the right-hand side in FIG. 1. In the opening, the N-doped layer 1 reaches up to the surface of the semiconductor disc. A thin region 192 at the surface of the plate is transformed into platinum silicide and forms, together with the layer 1, a Schottky diode junction. A contact 191, typically of polycrystalline silicon but alternatively, for example, of metal, is arranged on the layer 192 and extends in the lateral direction over the silicon dioxide layer 121. The contact 191 thereby acts as a so-called field plate and prevents field concentrations at the corners of underlying layers. The contact 191 is connected, via a connection (not shown), to the control means 17 of the field effect transistor $F_V$.

As previously mentioned the Schottky diode $SD_V$, which has low injection and relatively high leakage current, replaces the diodes $D_{V3}$ and $D_{V2}$ in the above-mentioned U.S. Pat. No. 4,331,884.

At an increasing voltage across the thyristor $T_V$, the barrier layer between the layers 1 and 14 is extended in the lateral direction. When the voltage has increased so far that the barrier layer is penetrated to the edge of the Schottky diode $SD_V$, an additional increase of the thyristor voltage does not give rise to any further increase of the voltage of the MOS control means 17 relative to the layer 14. The voltage of the MOS control means will thus be automatically limited without any separate protective diode being needed.

The lateral distance between the layer 192 and the surrounding edge of the layer 14 is adapted so that the voltage, at which the barrier layer between the layers 1 and 14 penetrates to the edge of the Schottky diode, becomes lower than the breakdown voltage of the MOS control means 17. The distance may be, for example, 10–20 $\mu$m, and the penetration voltage, i.e. the protective level, may be, for example, 20–30 V.

According to the embodiment shown in FIG. 1, a ring 193 of a P+-doped material is arranged at the edge of the Schottky diode. The ring is not necessary, but it provides a more even field configuration and contributes to avoid field concentrations at the corner of the contact 191. The level of protection is then the voltage at which the barrier layer between the layers 1 and 14 penetrates to the ring 193, and it can be set at the desired value by adjusting the distance a in FIG. 1.

The MOS transistor $F_V$ is dimensioned so as to obtain the desired turn-on voltage of the transistor.

The opening in the layer 14 may, for example, be rectangular with a size typically 100×300 $\mu$m. The layer 192 may then have a size of about 50×150 $\mu$m, and the distance a may be 20 $\mu$m. The N-doped layer 1 may have an impurity concentration of $10^{14}$ cm$^{-3}$ and the ring 193 a doping concentration of $10^{18}$–$10^{19}$ cm$^{-3}$.

The layers 193-1-14 may be conceived as a PNP varistor, which is designated $V_V$ in FIG. 2.

The control circuits for the thyristor $T_H$ are arranged at the lower surface of the silicon disc, shown in FIG. 1. They are identical with the control circuits for the thyristor $T_V$ and have in FIG. 1 the same reference numerals but with the first figure replaced with a "2".

In the embodiment of the invention described above, the Schottky diode is arranged at a certain distance from the base layer 14 of the thyristor $T_V$ located on the cathode side, i.e. the layer which is bounded by the PN junction bridged by the MOS transistor $F_V$. Alternatively, of course, the Schottky diode can be arranged close to, or in an opening in, a separate P-conducting layer which is connected to the base layer 14 or cathode of the thyristor $T_V$ and which will thus have a potential which substantially coincides with the potential of the cathode.

The embodiment of the invention described above is an example only and many modifications may be made thereto within the scope of the following claims.

What is claimed is:

1. In a two-pole overcurrent protection device for connection into a current-carrying conductor, the device comprising a normally conducting thyristor provided with turn-off means and having, in turn, a first emitter layer, a first base layer, a second base layer and a second emitter layer, and a MOS transistor integrated with the thyristor, connected in parallel with the PN-junction between said first emitter layer and said first base layer and arranged, when the voltage across the thyristor exceeds a predetermined value, to short-circuit the said PN-junction for turning off the thyristor, the improvement wherein the MOS transistor has control means connected via a Schottky diode to said second base layer of the thyristor, the Schottky diode comprising a junction between said second base layer and a contact layer arranged on said second base layer and connected to said control means of the MOS transistor, being arranged adjacent to, but separated from, a semiconductor layer which is of the same conduction type as said first base layer and which is connected to said first emitter layer, and having a reverse direction which coincides with the blocking direction of the thyristor.

2. An overcurrent protection device according to claim 1, comprising an annular semiconductor layer, of the same conduction type as said first base layer, arranged in said second base layer at the edge, and in contact with, said contact layer.

3. An overcurrent protection device according to claim 2, in which the distance between said annular semiconductor layer and said semiconductor layer adjacent to which the Schottky diode is arranged is so chosen that the voltage between these two layers, at which current starts to flow between the layers, is lower than the breakdown voltage of the control means of the MOS transistor.

* * * * *